United States Patent
Kim (10) Patent No.: US 7,881,117 B2
(45) Date of Patent: Feb. 1, 2011

(54) HIGH VOLTAGE GENERATOR CIRCUIT AND FLASH MEMORY DEVICE INCLUDING THE SAME

(75) Inventor: Tae-Seong Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 370 days.

(21) Appl. No.: 12/114,335

(22) Filed: May 2, 2008

(65) Prior Publication Data

US 2008/0273383 A1 Nov. 6, 2008

(30) Foreign Application Priority Data

May 3, 2007 (KR) ............................ 2007-43155

(51) Int. Cl.
*G11C 11/34* (2006.01)
*G11C 16/06* (2006.01)

(52) U.S. Cl. .............................. 365/185.2; 365/189.07

(58) Field of Classification Search .............. 365/185.2, 365/189.07, 189.09, 211; 327/538
See application file for complete search history.

(56) References Cited

U.S. PATENT DOCUMENTS

| 6,608,790 B2 | 8/2003 | Tran et al. |
| 6,791,865 B2 | 9/2004 | Tran et al. |
| 7,606,099 B2 * | 10/2009 | Chung ..................... 365/211 |
| 2003/0071679 A1 * | 4/2003 | Kono et al. ................ 327/538 |

FOREIGN PATENT DOCUMENTS

| JP | 2000-11671 | 1/2000 |
| KR | 2001-0061466 | 7/2001 |

* cited by examiner

*Primary Examiner*—Anh Phung
(74) *Attorney, Agent, or Firm*—F. Chau & Associates, LLC (57) ABSTRACT

A high voltage generator circuit includes a high voltage generator configured to generate a high voltage; and a control circuit configured to control the high voltage generator so as to vary the high voltage in response to variations of a peripheral temperature.

18 Claims, 7 Drawing Sheets

HIGH VOLTAGE GENERATOR CIRCUIT AND FLASH MEMORY DEVICE INCLUDING THE SAME

CROSS-REFERENCE TO RELATED APPLICATION

This application claims priority under 35 U.S.C. §119 of Korean Patent Application No. 2007-43155 filed on May 3, 2007, the disclosure of which is incorporated by reference herein.

BACKGROUND OF THE INVENTION

The present disclosure relates to a semiconductor memory device and, more particularly, to a semiconductor memory device using a high voltage.

A flash memory device is a non-volatile memory device that requires no power to retain information stored therein. Further, although a flash memory device does not operate at a higher speed than a DRAM used as a main memory in a PC, its read speed is high and is strong against impact compared to a hard disk.

A flash memory device is widely used as storage in applications that are powered by a battery. Further, a flash memory device is strong and able to endure high pressure and hot water.

A flash memory device is a computer memory device that is capable of electrically erasing and rewriting data. Unlike EEPROM, a flash memory device operates an erase/write operation in a block unit. A flash memory device is widely used in applications that require large-volume, non-volatile, and solid-state storage because it is less costly than EEPROM. The applications may include MP3 players, digital cameras, mobile phones, and the like. USB drives have been used to store data and to move data between computers. Conventional USB devices use flash memory devices.

Figure 1:
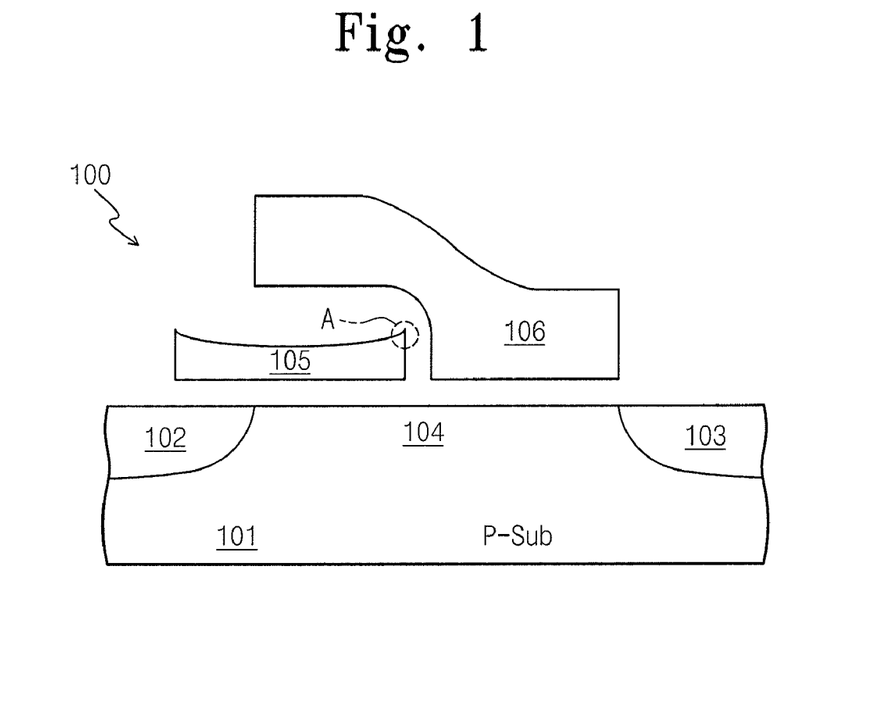
FIG. 1 is a cross-sectional view of a flash memory device with a split gate.
Figure 2:
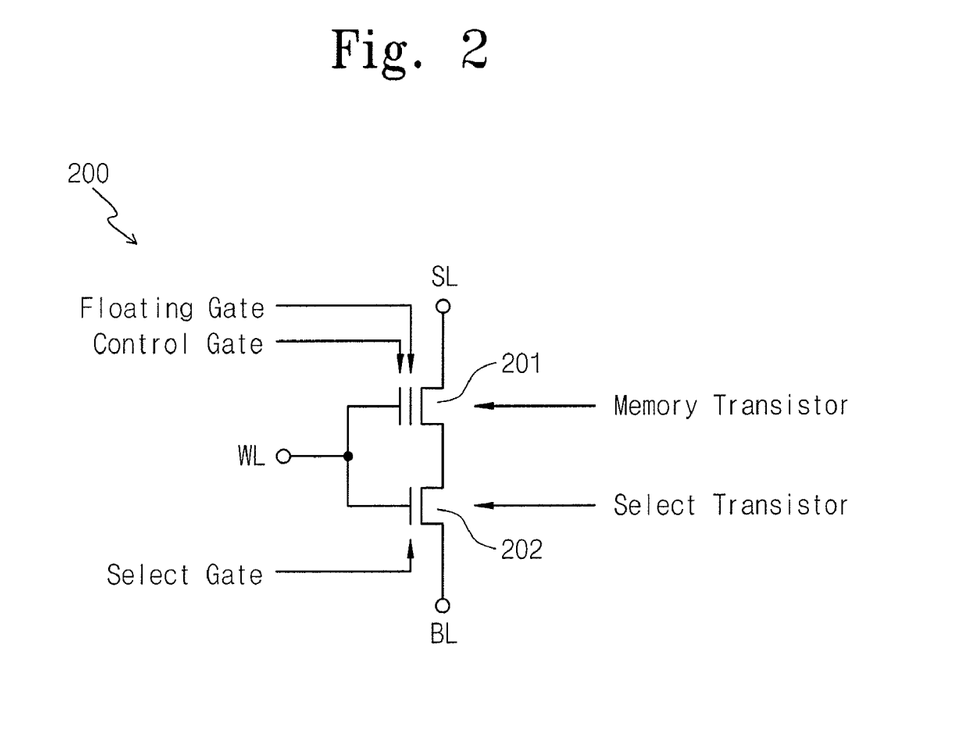
FIG. 2 is a schematic illustration of the flash memory cell which is an equivalent circuit of the split-gate flash memory device of FIG. 1.

A flash memory device with a split gate structure is used to store BIOS startup information for a personal computer or to store programs or data files for portable equipment such as mobile telephones and digital cameras, for example FIG. 1 is a cross-sectional view of a flash memory device with a split gate, and FIG. 2 is a schematic illustration of a flash memory cell which is an equivalent circuit of the split-gate flash memory device of FIG. 1.

Referring to FIG. 1, the split-gate flash memory device 100 includes a source region 102, a drain region 103 formed on a semiconductor substrate 101 and spaced apart from the source region 102 by the length of a channel region 104, a floating gate 105 formed over predetermined portions of the source region 102 and the channel region 104, and a control gate 106 formed over both the floating gate 105 and the channel region 104, and disposed at a lateral portion of the floating gate 105. The split-gate flash memory device 100 performs a program operation by accumulating a negative charge in the floating gate 105, and performs an erase operation by tunneling the accumulated charge to the control gate 106 at a peak portion A of the floating gate 105.

Referring to FIG. 2, the flash memory cell 200 includes a memory transistor 201 and a select transistor 202 that are serially connected between a source line SL and a bit line BL and are gated in common to a word line WL. The program or erase operation of the flash memory cell 200 may be achieved under the conditions of TABLE 1.

TABLE 1

| Operation | Sel/Unsel | BL | WL | SL | BULK |
|---|---|---|---|---|---|
| Program | Sel | 0 V | 1.5 V | 10 V | 0 V |
| | Unsel | VCC | 0 V | 0 V | 0 V |
| Erase | Sel | 0 V | 12 V | 0 V | 0 V |
| | Unsel | 0 V | 0 V | 0 V | 0 V |
| Read | Sel | 1 V | 3 V | 0 V | 0 V |
| | Unsel | 0 V | 0 V | 0 V | 0 V |

Voltages illustrated in TABLE 1 are exemplary, and may be changed appropriately for various flash memory devices.

As shown in TABLE 1, when applying 0V to the bit line BL, 1.5V (a threshold voltage VT of a transistor) to the word line WL, 10V (high voltage Vpp) to the source line SL and a bulk voltage of 0V, charge is accumulated in the floating gate 105 of the memory transistor 201 to thereby achieve the program operation of the flash memory cell 200.

When applying 0V to the bit line BL, 12V (erase voltage) to the word line WL, 0V to the source line SL and a bulk voltage of 0V, the accumulated charge of the floating gate 105 is discharged to thereby achieve the erase operation of the flash memory cell 200.

The read operation of the flash memory cell 200 is achieved by applying IV to the bit line BL, 3V (read voltage) to the word line WL, 0V to the source line SL and a bulk voltage of 0V. At this time, when a selected memory cell is a programmed cell, current does not flow between the drain and the source of the memory transistor 201, and thus, the memory cell is referred to as being "off". Meanwhile, if a selected cell is an erased cell, constant current flows between the drain and the source of the memory transistor 201, and thus, the memory cell is referred to as being "on".

A high voltage applied to a source line SL of a memory cell 200 may be maintained constant to increase the efficiency of the Hot Carrier Injection (HCI) for accumulating negative charge in a floating gate 105 of the flash memory device 100 of FIG. 1.

A high voltage from a high voltage generator circuit in a flash memory device may be applied to a source line via a source line decoder circuit. The source line decoder circuit may include one or more transistors for driving the source line, whose threshold voltages are varied according to a peripheral temperature. Accordingly, a program operation is affected by variation of the high voltage applied to a source line of a memory cell.

SUMMARY OF THE INVENTION

Embodiments of the present invention provide a high voltage generator circuit for applying a stable high voltage to a source line of a memory cell.

Further embodiments of the present invention provide a flash memory device including a high voltage generator circuit for applying a stable high voltage to a source line of a memory cell.

According to an exemplary embodiment of the present invention a high voltage generator circuit includes a high voltage generator generating a high voltage; and a control circuit controlling the high voltage generator so as to vary the high voltage in response to a peripheral temperature.

According to an exemplary embodiment of the present invention a flash memory device includes source lines connected with memory cells; a high voltage generator circuit generating a high voltage varying in response to a peripheral temperature; and a source line decoder circuit selecting one of the source lines in response to an operation mode signal and address signals, and driving the selected source line with the high voltage.

BRIEF DESCRIPTION OF THE FIGURES

Exemplary embodiments of the present invention will be described with reference to the following figures, wherein like reference numerals refer to like parts throughout the various figures unless otherwise specified.

DETAILED DESCRIPTION OF PREFERRED EMBODIMENTS

Exemplary embodiments of the present invention will be described below in detail with reference to the accompanying drawings. Like reference numerals refer to like elements throughout the accompanying figures.

Figure 3:
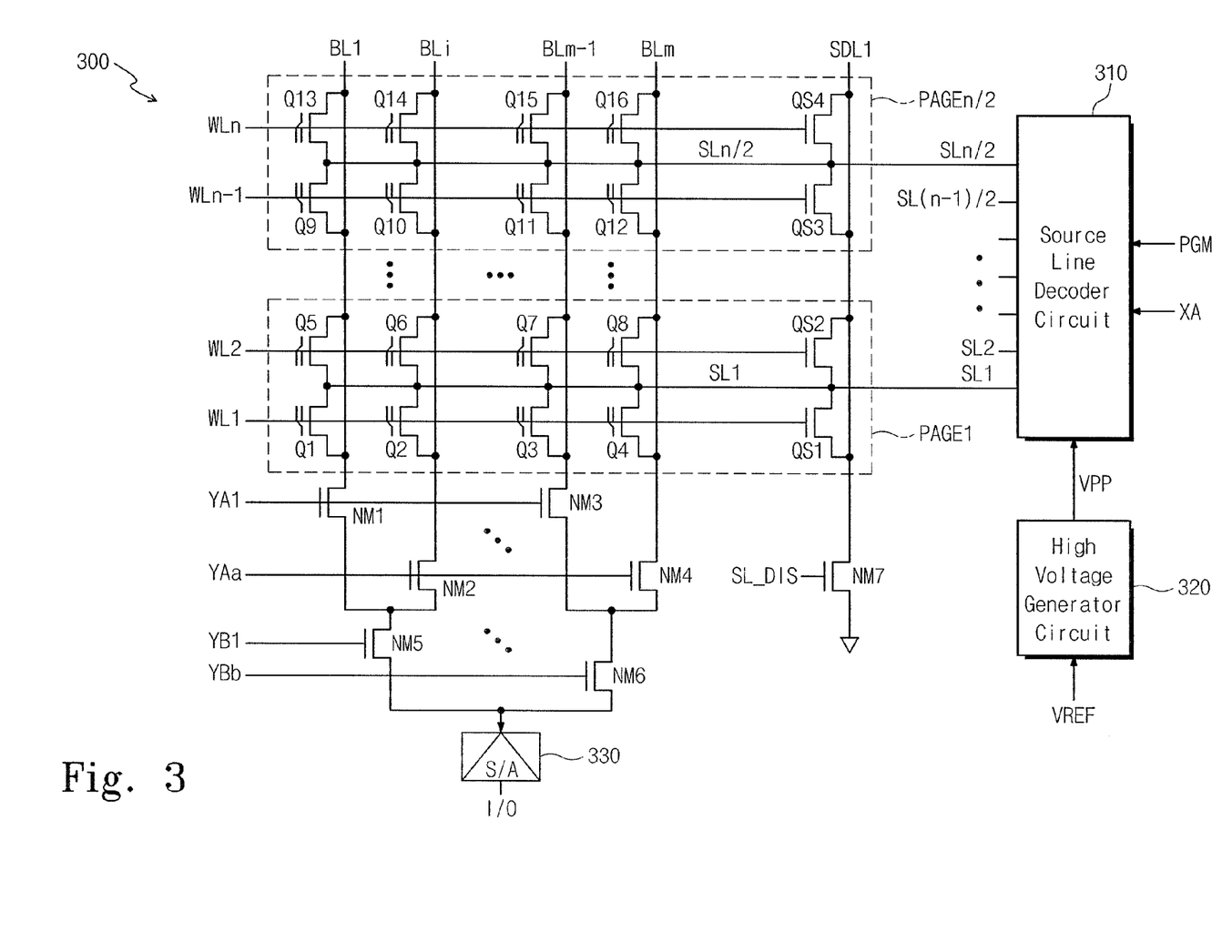
FIG. 3 is a block diagram showing a flash memory device according to an exemplary embodiment of the present invention.

FIG. 3 is a block diagram showing a flash memory device according to an exemplary embodiment of the present invention.

Referring to FIG. 3, a flash memory device may have plural bit lines connected to one input/output line I/O. The flash memory device may include a memory cell array 300, a source line decoder circuit 310, a high voltage generator circuit 320, and a sense amplifier circuit 330. Although not illustrated in FIG. 3, the flash memory device may further comprise a row decoder circuit, a column decoder circuit, an input/output interface, control logic, and the like.

The memory cell array 300 may include n word lines WL1~WLn, m bit lines BL1~BLm, n*m memory cells Q1~Q16 arranged at interconnections of the word lines WL1~WLn and the bit lines BL1~BLm, select transistors QS~QS4 connected to n/2 source lines SL1~SLn/2s, column select transistors NM1~NM6 connected to column addresses YA1, YAa, YB1, and YBb, and a discharge transistor NM7 connected to a source line discharge signal SL_DIS. Memory cells Q1~Q8 and select transistors QS1 and QS2, which are connected to two word lines (e.g., WL1 and WL2), are connected to a first source line SL1 and constitute a page. The memory cell array 300 may comprise n/2 pages, each of which is a unit of an erase operation. The source line decoder 310 may drive the source lines SL1~SLn/2 with 0V or a high voltage Vpp from the high voltage generator circuit 320 based upon a mode of operation. The source line decoder circuit 310 will be described later in detail. The sense amplifier circuit 330 may read data from a selected memory cell via the column transistors NM1~NM6, and the read data may be transferred to the input/output line I/O. The high voltage generator circuit 320 may receive a reference voltage VREF and generate a high voltage VPP for driving a source line related to a memory cell to be programmed.

Figure 4:
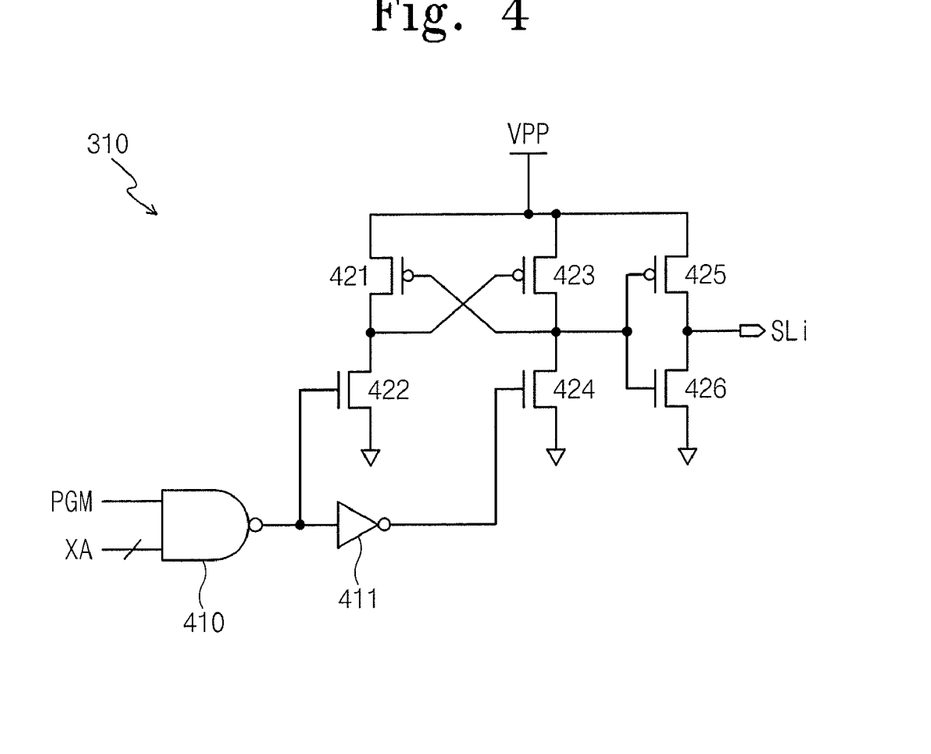
FIG. 4 is a circuit diagram showing a portion of a source line decoder circuit illustrated in FIG. 3.

FIG. 4 is a circuit diagram showing a portion of a source line decoder circuit illustrated in FIG. 3.

Referring to FIG. 4, a source line decoder circuit 310 may be configured to output a high voltage VPP to a selected source line SLi in response to a program mode signal PGM, indicating a program mode of operation, and decoded row address signals XA. The source line decoder 310 may include a NAND gate 410, an inverter 411, PMOS transistors 421, 423 and 425, and NMOS transistors 422, 424 and 426.

The NAND gate 410 receives the program mode signal PGM and the decoded row address signals XA, and the inverter 411 receives an output of the NAND gate 410. The PMOS and NMOS transistors 421 and 422 are connected in series between the high voltage VPP and a ground voltage, and the PMOS and NMOS transistors 423 and 424 are connected in series between the high voltage VPP and the ground voltage. A gate of the PMOS transistor 421 is connected to a connection node between the transistors 423 and 424, and a gate of the PMOS transistor 423 is connected to a connection node between the transistors 421 and 422. A gate of the NMOS transistor 422 is connected to an output of the NAND gate 410, and a gate of the NMOS transistor 424 is connected to an output of the inverter 411. The PMOS and NMOS transistors 425 and 426 are connected in series between the high voltage VPP and the ground voltage. Gates of the transistors 425 and 426 are connected in common to a connection node between the transistors 423 and 424. A connection node between the transistors 425 and 426 is connected to the source line SLi.

Figure 5:
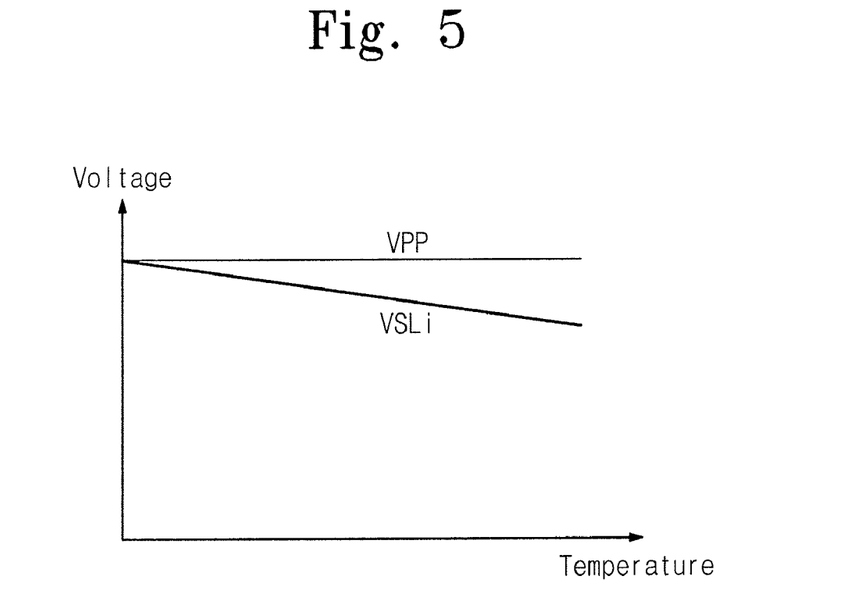
FIG. 5 is a graph showing variation of a voltage applied to a source line based upon variation of a peripheral temperature.

When the program mode signal PGM is activated high, and the decoded row address signals XA all are at a high level, the source line decoder 310 applies the high voltage VPP to the source line SLi. When the PMOS transistor 425 is turned on, ideally, its source and drain are shorted. However, the turned-on transistor 425 may actually have a drain-source on resistance RDS. Like general resistors, this on resistance may have a positive temperature characteristic, that is a resistance is raised according to increase in a temperature. In other words, as a temperature is raised, a drain-source voltage VDS of the PMOS transistor 425 becomes high. As a result, a voltage of the source line SLi becomes VSLi (=VPP−VDS) that is lower than the high voltage VPP. FIG. 5 is a graph showing variation of a voltage applied to a source line based upon variation of a peripheral temperature. Exemplary embodiments of the present invention provide a high voltage generator circuit that is capable of compensating for a voltage drop due to the PMOS transistor 425 in the source line decoder circuit 310.

Figure 6:
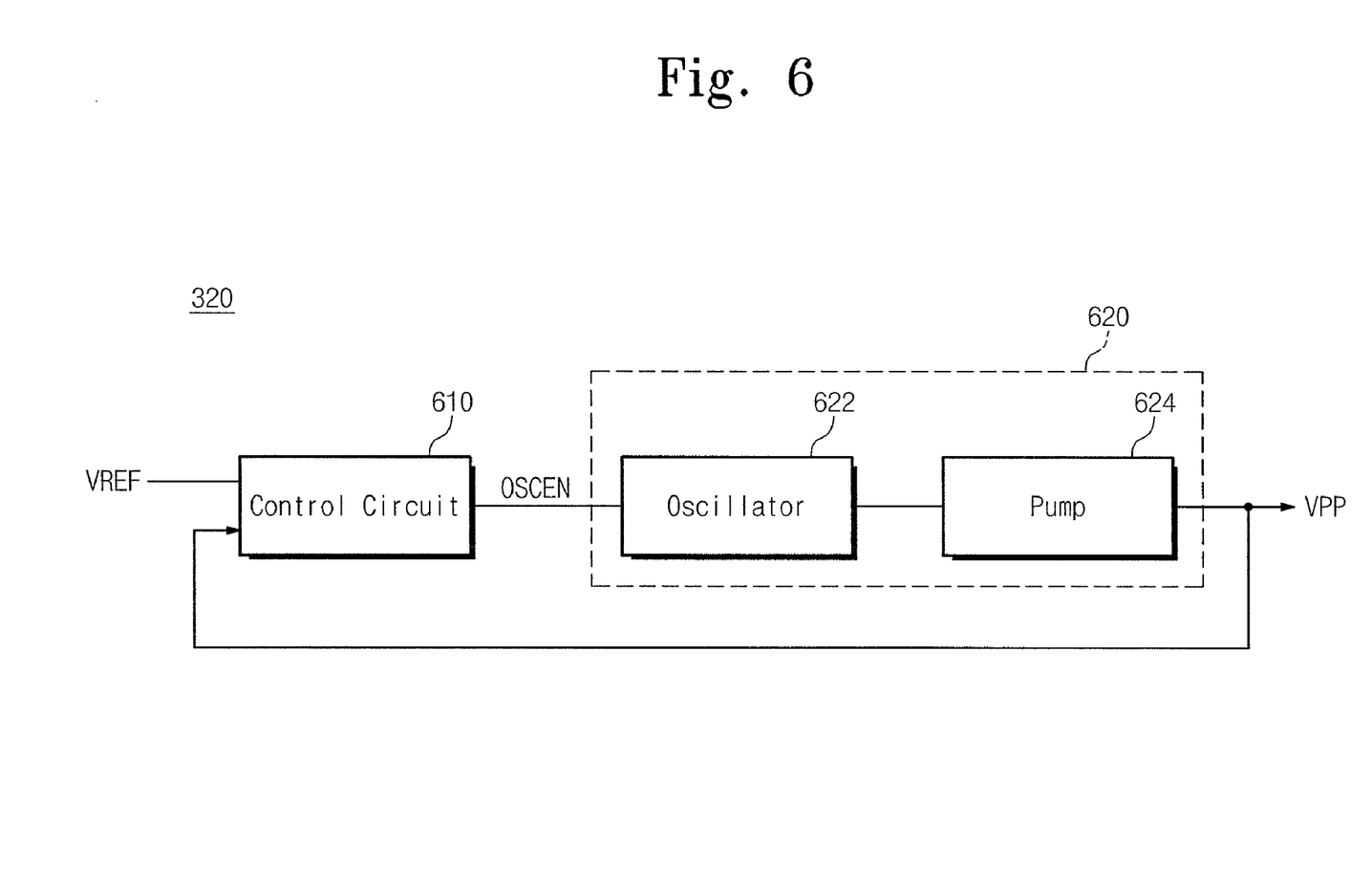
FIG. 6 is a block diagram showing a high voltage generator circuit illustrated in FIG. 3.

FIG. 6 is a block diagram showing a high voltage generator circuit illustrated in FIG. 3.

Referring to FIG. 6, a high voltage generator circuit 320 may include a control circuit 610 and a high voltage generator 620. The high voltage generator 620 may include an oscillator 622 and a pump/boost circuit 624. The control circuit 610 compares a reference voltage VREF and a high voltage VPP from the pump circuit 624 and outputs a control signal OSCEN for controlling the oscillator 622 as a comparison result. The oscillator 622 outputs an oscillation signal having a given frequency during an active state of the control signal OSCEN. The pump circuit 624 generates the high voltage VPP in response to the oscillation signal from the oscillator 622. The control circuit 610 according to the present invention may be configured to generate the control signal OSCEN such that the high voltage VPP is varied in response to a variation of a peripheral temperature.

Figure 7:
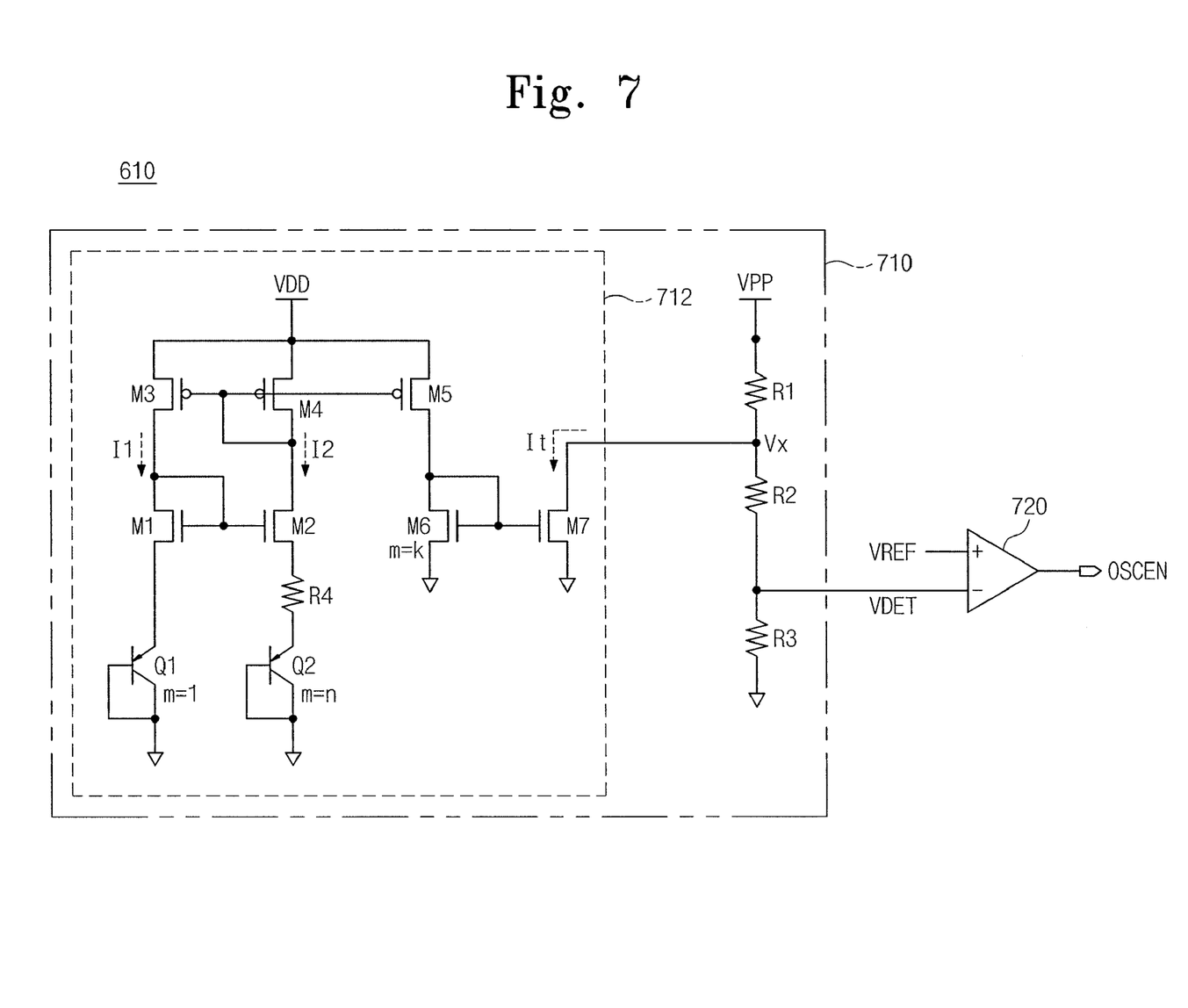
FIG. 7 is a circuit diagram showing a control circuit illustrated in FIG. 6 according to an exemplary embodiment of the present invention.

FIG. 7 is a circuit diagram showing a control circuit illustrated in FIG. 6 according to an exemplary embodiment of the present invention the present invention.

Referring to FIG. 7, a control circuit 610 may include a temperature detector 712, resistors R1~R3, and a comparator 720. The temperature detector 712 may comprise PMOS transistors M3~M5, NMOS transistors M1, M2, M6, and M7, and bipolar transistors Q1 and Q2.

The transistors M3, M1, and Q1 are connected in series between a power supply voltage VDD and a ground voltage in this order. A gate of the NMOS transistor M1 is connected with a source thereof. A base of the bipolar transistor Q1 is connected with a collector thereof. The PMOS transistor M4, the NMOS transistor M2, the resistor R4, and the bipolar transistor Q2 are connected in series between the power supply voltage VDD and the ground voltage in this order. A source of the PMOS transistor M4 is connected with its drain and the gate of the PMOS transistor M3. A gate of the NMOS transistor M2 is connected with a gate of the NMOS transistor M1. The PMOS and NMOS transistors M5 and M6 are connected in series between the power supply voltage VDD and the ground voltage. A gate of the PMOS transistor M5 is connected with gates of the PMOS transistors M3 and M4. A drain of the NMOS transistor M6 is connected with its gate. A drain of the NMOS transistor M7 is connected to a connection node between the resistors R1 and R2, its source is grounded, and its gate is connected with the gate of the NMOS transistor M6.

In FIG. 7, by way of example, only one bipolar transistor Q2 is connected between one end of the resistor R4 and a ground voltage. However, n bipolar transistors may be connected in parallel between the one end of the resistor R4 and the ground voltage, and k NMOS transistors M6 may be connected in parallel between the PMOS transistors M5 and the ground voltage. In this case, as illustrated in FIG. 7, only one bipolar transistor Q1 is connected between the NMOS transistor M1 and the ground voltage. Accordingly, a ratio of the bipolar transistor Q1 to the bipolar transistor Q2 is 1:n, and a ratio of the bipolar transistor Q2 to the NMOS transistor M6 is n:k.

The resistors R1~R3 are connected in series between a high voltage VPP and a ground voltage in this order. The comparator 720 has an non-inverting input terminal (+) connected with a reference voltage VREF, an inverting input terminal (−) connected with a connection node between the resistors R2 and R3, and an output terminal outputting a control signal OSCEN. A detection voltage VDET is output from the connection node of the resistors R2 and R3.

Current Ic flowing into a collector of each of the bipolar transistors Q1 and Q2 is as follows.

$$I_C = I_S \times e^{V_{EB}/V_T} \quad (1)$$

A voltage $V_{EB}$ is obtained from the current Ic and is as follows.

$$V_{EB} = V_T \times \ln(I_C/I_S) \quad (2)$$

Herein, Is indicates saturation current, $V_{EB}$ indicates an emitter-base voltage of each of bipolar transistors Q1 and Q2, and $V_T$ is kT/q. Herein, k is a constant, T indicates an absolute temperature, and q indicates the amount of charge. Since the signs k and q are constant irregardless of temperature, a relation between saturation currents Is1 and Is2 of bipolar transistors Q1 and Q2 is expressed by Is2=n*Is1. Assuming that the transistors M1 and M2 have the same size and that the transistors M3 and M4 have the same size, current I1 is identical to current I2, and a gate-source voltage VGS1 of the transistor M1 is identical to a gate-source voltage VGS2 of the transistor M2. Thus, the emitter-base voltage $V_{EB1}$ of the transistor Q1 is expressed as follows.

$$V_{EB1} = V_{EB2} + I_2 \times R4 \quad (3)$$

If the above-described equation (2) and Is2=n*Is1 are substituted for $V_{EB1}$ and $V_{EB2}$, the following equation is obtained.

$$V_T \times \ln(I1) = V_T \times \ln(I2) - V_T \times \ln(n) + I2 \times R4 \quad (4)$$

If I1=I2, current I2 is expressed as follows.

$$I2 = (V_T/R4) \times \ln(n) \quad (5)$$

Current It obtained by mirroring the current I2 is as follows.

$$It = (1/k) \times (V_T/R4) \times \ln(n) \quad (6)$$

Herein, since $V_T$ is proportional to a temperature, current is varied in proportion to a temperature. Accordingly, it is possible to adjust current It flowing into the temperature detector 712 by varying k, a resistance of the resistor R4, and the number of bipolar transistors R2.

As understood from the above description, current It is increased in proportion to variation of a temperature, so that current flowing the resistor R2 is also varied.

In accordance with Kirchhoff's law, current at a connection node between the resistors R1 and R2 is as follows.

$$((VPP - V_x)/R1) - (VREF/R3) - It = 0 \quad (7)$$

Herein, Vx is a voltage of the connection node between the resistors R1 and R2. Since Vx=((R2+R3)/R3)*VREF, a high voltage VPP is as follows.

$$VPP = VREF \times ((R1 + R2 + R3)/R3) + It \times R1 \quad (8)$$

When the equation 6 is substituted for current It in the equation 8, the high voltage VPP is expressed as follows.

$$VPP = ((R1 + R2 + R3)/R3) \times VREF) + (R1/R4) \times V_T \times \ln(n) \quad (9)$$

That is, the high voltage VPP is increased in proportion to a temperature.

The equations 7~9 are derived under the condition that the detection voltage VDET reaches the reference voltage VREF. Accordingly, the detection voltage VDET is obtained from the equation 9 and is expressed as follows.

$$VDET = (R3/(R1 + R2 + R3)) \times (VPP - (R1/R4) \times V_T \ln(n)) \quad (10)$$

That is, the detection voltage VDET is a voltage that is obtained by dividing the high voltage VPP. If the detection voltage VDET is varied in proportion to the high voltage VPP or a peripheral temperature is raised, a raising rate of the detection voltage VDET with respect to the high voltage VPP may be reduced. As a result, the control signal OSCEN from the comparator 720 may be maintained at a high level during a longer period of time in order to maintain the oscillator 622 at an operating state.

Figure 8:
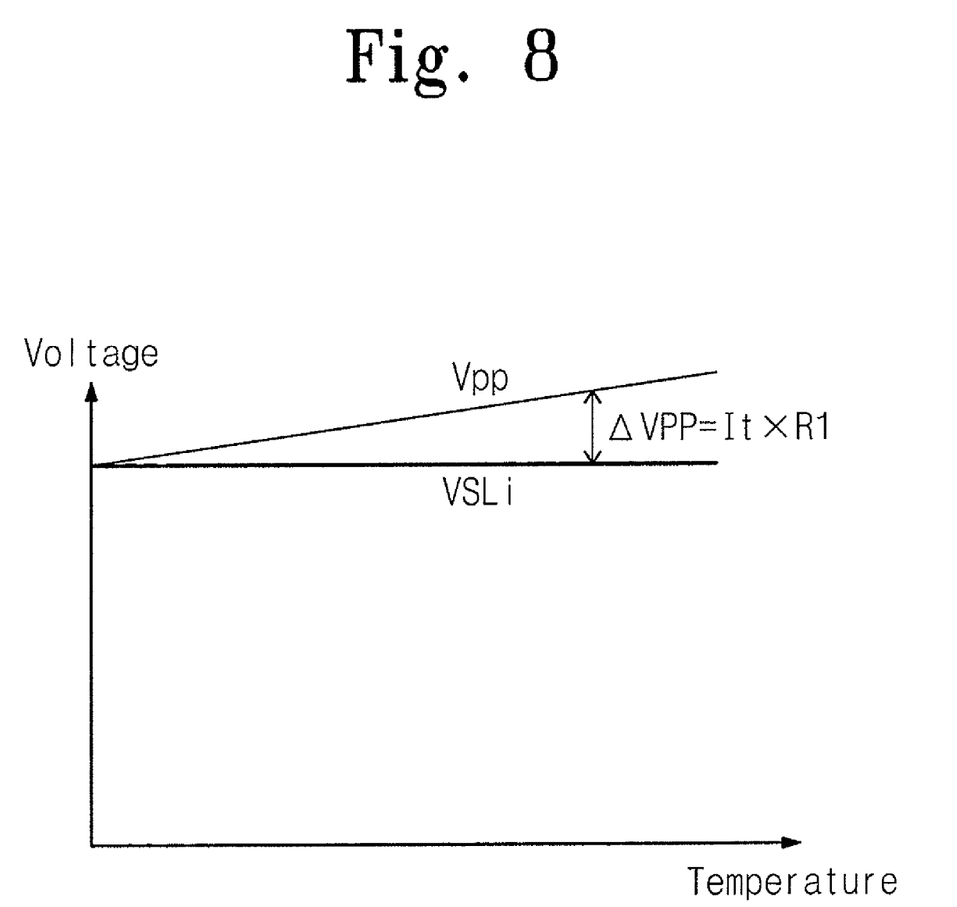
FIG. 8 is a graph showing variation of a high voltage and variation of a voltage applied to a source line when a peripheral temperature is varied.

As illustrated in FIG. 8, the high voltage VPP from the high voltage generator circuit 320 increases in proportion a rising peripheral temperature. Accordingly, a voltage drop due to a PMOS transistor 425 in a source decoder 410 (refer to FIG. 4) is compensated, and a stable high voltage VSLi is applied to a source line SLi in the compensation scheme.

Figure 9:
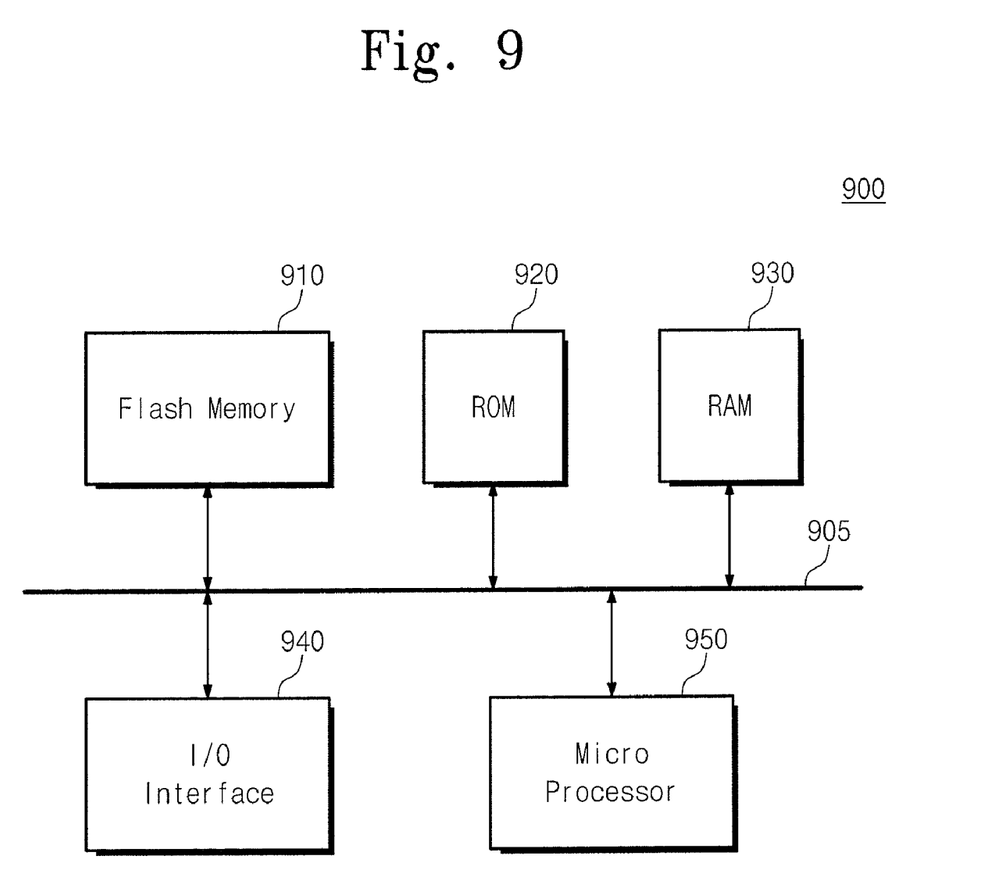
FIG. 9 is a block diagram showing a smart card including a flash memory device according to an exemplary embodiment of the present invention.

FIG. 9 is a block diagram showing a smart card including a flash memory device according to an exemplary embodiment of the present invention.

A smart card is a card that incorporates an integrated circuit chip with the capability of processing specific transactions by using a microprocessor, a card OS, a security module, a memory, and the like. The smart card has the same size and shape as a conventional magnetic stripe card. Smart cards may include a contact-type card and contactless cads such as Contactless IC Card and Remote Coupling Communication Card.

Referring to FIG. 9, a smart card 900 may include a flash memory device 910, ROM 920, RAM 930, an input/output interface 940, and a microprocessor 950 which are connected to a bus 905. The input/output interface 940 may be configured to interface with the external according to a protocol such as ISO 7816. The microprocessor 950 may be configured to control an entire operation of the smart card 900. The flash memory device 910 is substantially identical to that illustrated in FIG. 3. That is, the flash memory device 910 may be configured such that a stable high voltage is applied to a source line irregardless of variation of a peripheral temperature.

Although not illustrated in FIG. 9, the smart card 900 may further comprise a cipher/decipher block, a security block, a clock generator circuit, and the like. Further, a flash memory device according to at least one embodiment of the present invention may be incorporated in various applications such as a memory stick, a memory card, a portable electronic apparatus, and the like.

As set forth above, a present flash memory device with a split gate structure is capable of applying a stable high voltage to a source line irregardless of variation of a peripheral temperature. Accordingly, the reliability of products is improved by performing a stable program operation of the flash memory device.

Although exemplary embodiments of the present invention have been described for illustrative purposes, those skilled in the art will appreciate that various modifications, additions and substitutions are possible, without departing from the scope and spirit of the disclosure.

What is claimed is:

1. A high voltage generator circuit comprising:
   a high voltage generator configured to generate a high voltage to a source line of a flash memory cell; and
   a control circuit configured to control the high voltage generator so as to vary the high voltage in response to variations of a peripheral temperature.

2. The high voltage generator circuit of claim 1, wherein the control circuit controls the high voltage generator so as to vary the high voltage in response to the peripheral temperature until the high voltage equals a target voltage.

3. The high voltage generator circuit of claim 1, wherein the control circuit comprises:
   a detector generating a detection voltage corresponding to the high voltage in response to the peripheral temperature; and
   a comparator comparing the detection voltage and the reference voltage to generate a control signal in response to the comparison result.

4. The high voltage generator circuit of claim 3, wherein the detector comprises:
   first, second, and third resistors connected in series between the high voltage and a ground voltage; and
   a temperature detector connected to a connection node between the first and second resistors and configured to consume a variable current varying in response to the peripheral temperature,
   wherein the detection voltage is output from the connection node between the first and second resistors.

5. The high voltage generator circuit of claim 4, wherein the temperature detector is configured to increase the current consumption in proportion to an increase in the peripheral temperature.

6. The high voltage generator circuit of claim 5, wherein the detection voltage is decreased as the current consumption is increased.

7. The high voltage generator circuit of claim 5, wherein a rising rate of the detection voltage is inversely proportional to the peripheral temperature.

8. A flash memory device comprising:
   source lines connected with flash memory cells;
   a high voltage generator circuit configured to generate a high voltage to a source line of a flash memory cell, the high voltage being variable in response to variations of a peripheral temperature; and
   a source line decoder circuit configured to select one of the source lines in response to an operation mode signal and address signals and to drive the selected source line with the high voltage.

9. The flash memory device of claim 8, wherein the high voltage generator circuit increases the high voltage in proportion to an increase in the peripheral temperature.

10. The flash memory device of claim 8, wherein the high voltage generator circuit comprises:
    a high voltage generator configured to generate the high voltage; and
    a control circuit configured to compare a reference voltage and a detection voltage corresponding to the high voltage, and generating a control signal for controlling the high voltage generator,
    wherein a rising rate of the detection voltage corresponding to the high voltage is varied according to the peripheral temperature.

11. The flash memory device of claim 10, wherein a rising rate of the detection voltage is inversely proportional to the peripheral temperature.

12. The flash memory device of claim 10, wherein the control circuit comprises:
    a detector generating the detection voltage corresponding to the high voltage in response to the peripheral temperature; and
    a comparator comparing the detection voltage and the reference voltage and to generate the control signal in response to the comparison result.

13. The flash memory device of claim 12, wherein the detector comprises:
    first, second, and third resistors connected in series between the high voltage and a ground voltage; and
    a temperature detector connected to a connection node between the first and second resistors and configured to consume a variable current varying in response to the peripheral temperature,
    wherein the detection voltage is output from the connection node between the first and second resistors.

14. The flash memory device of claim 13, wherein the temperature detector is configured to increase the current consumption in proportion to an increase in the peripheral temperature.

15. The flash memory device of claim 14, wherein the detection voltage is decreased as the current consumption is increased.

16. A high voltage generator circuit comprising:
a high voltage generator configured to generate a high voltage to a memory cell; and
a control circuit configured to control the high voltage generator so as to vary the high voltage in response to variations of a peripheral temperature,
wherein the memory cell has a split gate structure.

17. A memory device comprising:
source lines connected with memory cells;
a high voltage generator circuit configured to generate a high voltage that varies in response to variations of a peripheral temperature; and
a source line decoder circuit configured to select one of the source lines in response to an operation mode signal and address signals and to drive the selected source line with the high voltage,
wherein each of the memory cells has a split gate structure.

18. A high voltage generator circuit comprising:
a high voltage generator configured to generate a high voltage; and
a control circuit configured to control the high voltage generator so as to vary the high voltage in response to variations of a peripheral temperature,
wherein the control circuit comprises:
a detector that generates a detection voltage that corresponds to the high voltage in response to the peripheral temperature; and
a comparator that compares the detection voltage and the reference voltage to generate a control signal in response to the comparison result,
wherein the detector comprises:
first, second, and third resistors connected in series between the high voltage and a ground voltage; and
a temperature detector connected to a connection node between the first and second resistors and configured to consume a variable current that varies in response to the peripheral temperature, and
wherein the detection voltage is output from the connection node between the first and second resistors.

* * * * *